United States Patent
Kanbe

(10) Patent No.: US 8,084,286 B2
(45) Date of Patent: Dec. 27, 2011

(54) SOLID-STATE IMAGING DEVICE, CAMERA AND METHOD OF PRODUCING THE SOLID-STATE IMAGING DEVICE

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/943,440

(22) Filed: Nov. 10, 2010

(65) Prior Publication Data
US 2011/0053305 A1    Mar. 3, 2011

Related U.S. Application Data

(60) Continuation of application No. 12/248,633, filed on Oct. 9, 2008, now Pat. No. 7,843,027, which is a division of application No. 11/169,592, filed on Jun. 26, 2005, now Pat. No. 7,452,742.

(30) Foreign Application Priority Data

Jun. 30, 2004  (JP) .................................. 2004-193278

(51) Int. Cl.
*H01L 21/00*    (2006.01)
(52) U.S. Cl. ...................... 438/58; 438/90; 257/E21.318
(58) Field of Classification Search ............. 438/57, 438/58, 90; 257/E21.318
See application file for complete search history.

(56) References Cited

U.S. PATENT DOCUMENTS

| | | | |
|---|---|---|---|
| 6,025,585 A | 2/2000 | Holland | |
| 6,504,196 B1 | 1/2003 | Rhodes | |
| 6,670,258 B2 * | 12/2003 | Carlson et al. | ............. 438/471 |
| 2001/0054723 A1 | 12/2001 | Narui | |
| 2002/0038874 A1 | 4/2002 | Egashira | |
| 2003/0170928 A1 | 9/2003 | Shimozono et al. | |
| 2003/0214595 A1 | 11/2003 | Mabuchi | |
| 2004/0005729 A1 | 1/2004 | Abe et al. | |
| 2004/0113185 A1 | 6/2004 | Shibayama et al. | |
| 2006/0006488 A1 | 1/2006 | Kanbe | |

(Continued)

FOREIGN PATENT DOCUMENTS

JP    01-274468    11/1989
(Continued)

OTHER PUBLICATIONS

European Search Report corresponding to European Serial No. 10008545 dated Oct. 20, 2010.

(Continued)

*Primary Examiner* — Zandra Smith
*Assistant Examiner* — Paul Patton
(74) *Attorney, Agent, or Firm* — SNR Denton US LLP

(57) ABSTRACT

Producing a solid-state imaging device by (1) forming a structure including (a) a substrate having a first impurity with a first concentration, (b) a first conductive type Si layer and (c) a first conductive type impurity layer stacked on one another in that order, the first conductive type Si layer being formed on the substrate, the first conductive type impurity layer being formed in a boundary region including a boundary of the substrate and the Si layer, and a part of the substrate facing the boundary and a part of the first conductive type Si layer facing the boundary having a second impurity; and (2) forming in the Si layer a second conductive type region capable of storing in the Si layer a charge generated by a photoelectric conversion; and forming an interconnection layer on the Si layer.

10 Claims, 6 Drawing Sheets

U.S. PATENT DOCUMENTS

2006/0125038 A1   6/2006   Mabudhi

FOREIGN PATENT DOCUMENTS

| JP | 2002-043557 | 2/2002 |
| JP | 2003-273343 | 9/2003 |
| JP | 2003-338615 | 11/2003 |
| JP | 2004-134672 | 4/2004 |
| JP | 2004134672 | 4/2004 |

OTHER PUBLICATIONS

Japanese Office Action issued on Sep. 6, 2011 in connection with counterpart JP Application No. 2008-215998.

* cited by examiner

LIGHT

SOLID-STATE IMAGING DEVICE, CAMERA AND METHOD OF PRODUCING THE SOLID-STATE IMAGING DEVICE

CROSS REFERENCE TO RELATED APPLICATIONS

This application is a continuation of U.S. patent application Ser. No. 12/248,633, filed Oct. 9, 2008, which is a division of U.S. patent application Ser. No. 11/169,592, filed Jun. 29, 2005, the entirety of which is incorporated herein by reference to the extent permitted by law. The present invention claims priority to Japanese Patent Application No. JP 2004-193278 filed in the Japanese Patent Office on Jun. 30, 2004, the entire contents of which are incorporated herein by reference.

BACKGROUND OF THE INVENTION

The present invention relates to a back illumination type (back-illuminated) solid-state imaging device receiving light from an opposite side to a surface formed with an interconnection layer, a camera including the same and a method of producing the same.

In recent year, in terms of an improvement of an aperture ratio for receiving light and an improvement of a flexibility of a layout of an interconnection layer, a back-illuminated solid-state imaging device in which a semiconductor layer is formed on its surface side with the interconnection layer and illuminated with light from a back surface side thereof to take an image has been known. As the back-illuminated solid-state imaging device, a charged coupled devices (CCD) type and a metal oxide semiconductor (MOS) type have been proposed. For example, the CCD type is disclosed in Japanese Unexamined Patent Publication (Kokai) No. 2002-151673, and the MOS type is disclosed in Japanese Unexamined Patent Publication (Kokai) No. 2003-31785.

If the semiconductor layer formed with a light receiving unit is invaded by metal in a production process of the back-illuminated solid-state imaging device, a crystal defect may occur due to metal to generate an image defect called as a "white scratch". In order to suppress the image defect, the production process of the back-illuminated solid-state imaging device has to be considered with how to perform a gettering of metal invading the semiconductor layer in the process. A gettering layer for gettering metal is generally formed at outside of an active region of the semiconductor layer.

SUMMARY OF THE INVENTION

In the production process for the back-illuminated solid-state imaging device, a formation of the gettering layer may be restricted. For example, when producing the back-illuminated solid-state imaging device by using a silicon layer of an SOI substrate, if forming the gettering layer on the silicon substrate opposed to the silicon layer via a silicon oxide layer, the silicon oxide layer may function as a barrier and the metal invading the silicon layer may not be able to be performed with the gettering.

On the other hand, it is important to suppress an occurrence of a dark current and a deterioration of sensibility due to a depletion of a boundary to be a light incidence surface (a back surface) of the semiconductor layer. Therefore, the process has to be considered so as to improve a concentration of a majority carrier at the boundary portion of the semiconductor layer.

The present invention is to provide a method of producing a solid-state imaging device able to suppress the crystal defects caused by a metal contamination in a process and to suppress the dark current to improve quantum efficiency.

And the present invention is to provide a solid-state imaging device able to suppress the dark current to improve the quantum efficiency, and to provide a camera for the same.

According to an embodiment of the present invention, there is provided a method of producing a solid-state imaging device including the steps of forming a structure including a substrate, a first conductive type epitaxial layer and a first conductive type impurity layer, the first conductive type epitaxial layer being formed on the substrate including a gettering layer to have a first impurity concentration, and the first conductive type impurity layer being formed in a boundary region including a boundary of the substrate and the epitaxial layer, a part of the substrate facing the boundary and a part of the epitaxial layer facing the boundary to have a second impurity concentration higher than the first impurity concentration of the epitaxial layer; forming a second conductive type region storing a charge generated by a photoelectric conversion in the epitaxial layer; forming an interconnection layer on the epitaxial layer; and removing the substrate.

According to an embodiment of the present invention, there is provided a solid-state imaging device in which a first conductive type epitaxial layer is formed on its first surface with an interconnection layer and light is received at a second surface of the epitaxial layer, the solid-state imaging device including a second conductive type region formed in the epitaxial layer with a first impurity concentration and storing a charge generated by a photoelectrical conversion, and a first conductive type impurity layer formed closer to the second surface side of the epitaxial layer than the second conductive type region and having a second impurity concentration higher than the first impurity concentration, wherein the second impurity concentration has a concentration gradient increasing toward the second surface side.

According to an embodiment of the present invention, there is provided a camera having a solid-state imaging device in which a first conductive type epitaxial layer is formed on its first surface with an interconnection layer and light is received at a second surface side of the epitaxial layer; an optical system focusing light on the second surface of the solid-state imaging device; and a signal processing circuit performing a predetermined signal processing with respect to an output signal from the solid-state imaging device, wherein the solid-state imaging signal includes a second conductive type region formed in the epitaxial layer with a first impurity concentration and storing a charge generated by a photoelectrical conversion, and a first conductive type impurity layer formed closer to the second surface side of the epitaxial layer than the second conductive type region and having a second impurity concentration higher than the first impurity concentration, wherein the second impurity concentration has a concentration gradient increasing toward the second surface.

According to a method of producing a solid-state imaging device of an embodiment of the present invention, it is able to suppress the crystal defects caused by the metal contamination in the process and to suppress the dark current to improve the sensitivity.

According to a solid-state imaging device and a camera of an embodiment of the present invention, it is able to reduce the loss of photo generated carriers and to improve the quantum efficiency.

BRIEF DESCRIPTION OF THE DRAWINGS

These features of embodiments of the present invention will be described in more detail with reference to the accompanying drawings, in which.

DETAILED DESCRIPTION OF THE PRESENTLY PREFERRED EMBODIMENTS

Preferred embodiments of the present invention will be described with reference to the drawings. The present embodiment will be described with examples using an electron as a signal charge, a p-type as a first conductive type, and an n-type as a second conductive type. Note that, if using a hole as the signal charge, the above polarities may be reversed.

Figure 1:
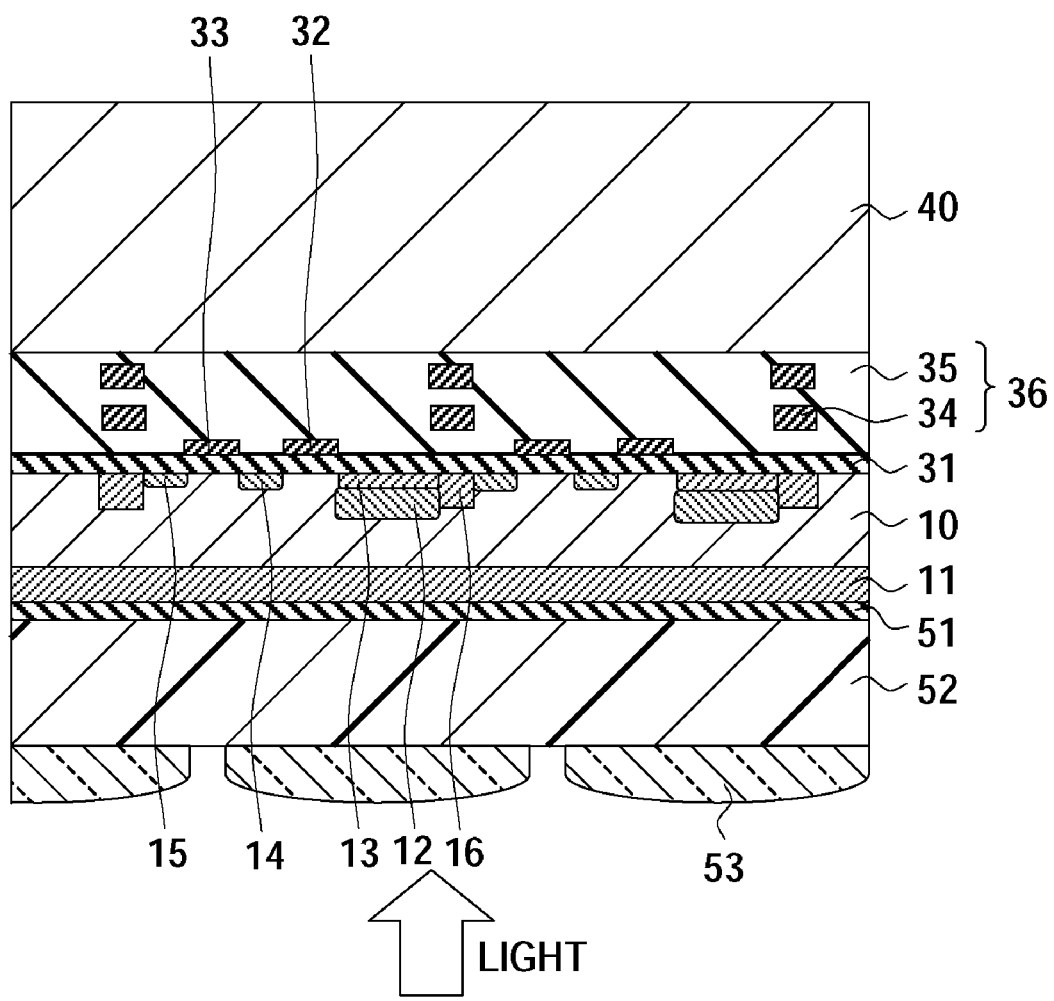
FIG. 1 is a cross-sectional view of a solid-state imaging device according to the present embodiment.

FIG. 1 is a cross-sectional view of a solid-state imaging device according to the present embodiment. In the present embodiment, a MOS type solid-state imaging device referred to a CMOS image sensor will be described.

In the present embodiment, a p-type epitaxial layer 10 of silicon is used as a substrate. The thickness of the p-type epitaxial layer 10 depends on a kind and application of the solid-state imaging device, and is preferably 4 to 6 μm for visible light or 6 to 10 μm for near-infrared radiation. Further, a p-type impurity concentration (a first impurity concentration) of the p-type epitaxial layer 10 also depends on the kind and application of the solid-state imaging device, and is preferably almost $1 \times 10^{14}$ to $5 \times 10^{16}$ cm$^{-3}$.

The p-type epitaxial layer 10 is formed above its first surface (surface) with an interconnection layer 36. The solid-state imaging device according to the present embodiment is produced so as to receive light from a second surface (back surface) opposed to the surface where the interconnection layer 36 is formed. Namely, a back-illuminated solid-state imaging device is produced.

The p-type epitaxial layer 10 is formed in its second surface with a p+-type impurity layer (first conductive type impurity layer) 11 containing the p-type impurity. Concentration of the p-type impurity of the p+-type impurity layer 11 (a second impurity concentration) is higher than the p-type epitaxial layer 10. In descriptions blow, the solid-state imaging device according to the present embodiment is able to suppress an occurrence of a dark current and improve quantum efficiency by the p+-type impurity layer 11.

An n-type region 12 is formed in every pixel of the p-type epitaxial layer 10. Incidence Light of the p-type epitaxial layer 10 is converted to an electrical signal by a photo diode mainly formed by a pn junction between the p-type epitaxial layer 10 and the n-type region 12, and a signal charge is stored in the n-type region 12.

A p+-type region 13 to make a buried photo diode is formed in the first surface of the p-type epitaxial layer 10, namely, on the n-type region 12. The p+-type region 13 has a similar function to the p+-type impurity layer 11.

An n-type region 14 and an n-type region 15 are formed in the first surface of the p-type epitaxial layer 10. The n-type region 14 becomes a floating diffusion, and the n-type region 15 becomes a source or drain of a transistor other than a transfer transistor. Further a p-type region 16 sectionalizing a pixel region is formed at the first surface of the p-type epitaxial layer 10 in order to prevent a leakage of the signal charge to adjoining pixels.

A gate electrode 32 of the transfer transistor and a gate electrode 33 of a transistor other than the transfer transistor are formed on the first surface of the p-type epitaxial layer 10 via the gate insulation film 31. Note that, FIG. 1 shows only a single transistor other than the transfer transistor, however the number is not limited to.

The interconnection layer 36 in which an interconnection 34 and an interlayer insulation film 35 are stacked is formed on the first surface of the p-type epitaxial layer 10 so as to cover transistors. The interconnection 34 is formed by aluminum and the interlayer insulation film 35 is formed by silicon oxide, for example. FIG. 1 shows a two-layered interconnection, however the interconnection layer 36 may be a three- or four-layered interconnection.

A supporting substrate 40 is formed on the surface of the interconnection 36 to improve strength of the p-type epitaxial layer 10. The supporting layer 40 is preferably formed by silicon in order to prevent a warp caused by a difference of a thermal expansion coefficient with the p-type epitaxial layer 10, also may be formed by silica grass. Note that, if securing the strength of the p-type epitaxial layer 10, the supporting substrate 40 may not be formed.

A passivation film 51 of silicon nitride is formed on the second surface of the p-type epitaxial layer 10 via a not shown silicon oxide film. The passivation film 51 is formed on its surface with a color filter 52 and an on-chip lens 53 which are successively stacked on each other. Note that, it is omitted with the illustration in the drawing, a shield film opening the respective pixels may be provided between a not shown silicon oxide film and the passivation film 51.

With the above solid-state imaging device, the p-type epitaxial layer 10 is illuminated with light from the second surface (back surface) via the on-chip lens 53 and the color filter 52. Consequently, electrons are generated in the p-type epitaxial layer 10 by the incidence of light and stored in the n-type region 12, not trapped in the vicinity of the boundary (the second surface).

If the transfer transistor is turned on by applying voltage to the gate electrode 32, the electrons stored in the n-type region 12 are transferred to the n-type region 14 to be the floating diffusion. The n-type region 14 is, omitted in the drawing, connected to the gate electrode of the amplifying transistor, and a potential of the n-type region 14 is amplified by the amplifying transistor and output.

After a read out operation, the potential of the n-type region 14 to be the floating diffusion is reset to a power source potential, namely, the electrons stored in the n-type region 14 are drained.

Figure 2:
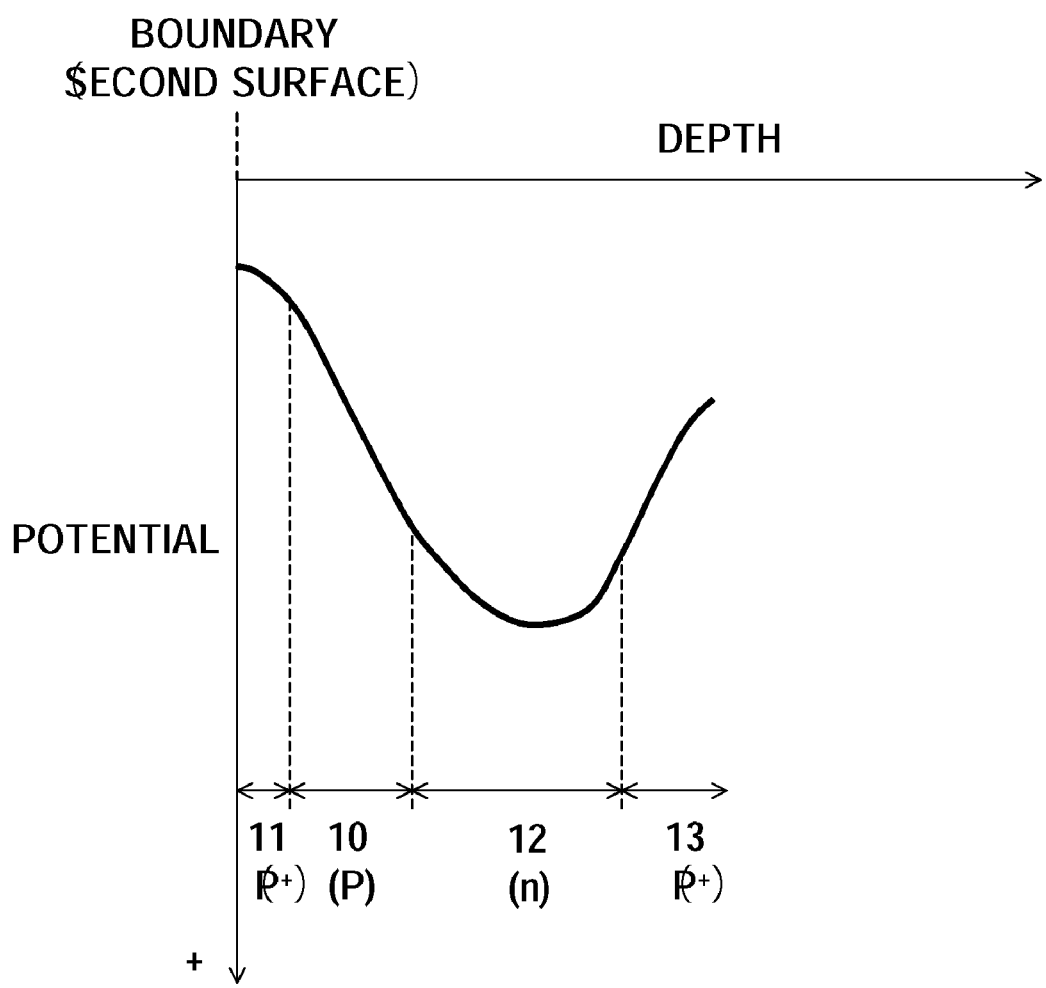
FIG. 2 is a view of a potential from a second surface to a p+-type region in a p-type epitaxial layer.

FIG. 2 is a view of the potential from the second surface to the p+-type region 13 in the p-type epitaxial layer 10.

The p-type epitaxial layer 10 has a potential which is raised in the depth direction from the p+-type impurity layer 11 of the second surface toward the n-type region 12. And the potential is dropped from the n-type region 12 to the p+-type region 13.

In the present embodiment, the p-type epitaxial layer 10 does not have a potential-well at the second surface. If the potential-well is formed at the second surface, the electrons generated by the photoelectric conversion may be stored in the second surface. Consequently, the electrons stored in the second surface may not be able to be read out or drained entirely, so that it may cause the dark current and the deterioration of the quantum efficiency.

With the present embodiment, the p-type epitaxial layer 10 is not formed in the second surface with the potential-well, so that the electrons generated by the photoelectrical conversion are efficiently stored in the n-type region 12 having the highest potential. The electrons stored in the n-type region 12 can be read out or drained entirely, so that the dark current can be suppressed and the quantum efficiency can be improved.

In order to form the potential distribution shown in FIG. 2, the p$^+$-type impurity layer 11 is formed on the second surface so as to have a higher concentration than the p-type epitaxial layer 10 and to have the maximum concentration of the impurity at the second surface of the boundary.

Next, the method of producing the solid-state imaging device according to the present embodiment will be described with reference to FIGS. 3A to 3G.

Figure 3A:
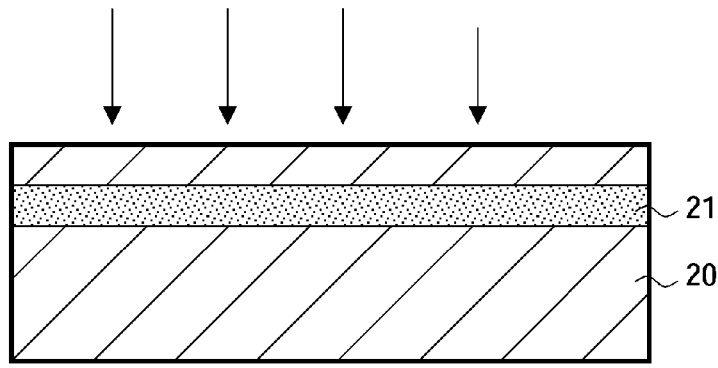
FIGS. 3A to 3G are cross-sectional views of a process for producing the solid-state imaging device according to the present embodiment.

As shown in FIG. 3A, the substrate 20 is performed with an ion implantation of carbon ion of a group IV element to form a gettering layer 21 at the predetermined depth from the surface of the substrate 20. Note that, the ion implantation may be performed by using Si, Ge or other group IV element except carbon. The substrate 20 is for example a single crystal silicon substrate formed by the Czochralski (CZ) process. Before the ion implantation, a silicon oxide film may be formed on the substrate 20 as a contamination prevention film for preventing a contamination or a channeling caused by the ion implantation. The substrate 20 is a p-type substrate in the case of a device in which an electron is used as a signal. The amount of carbon to be implanted is almost $1 \times 10^{14}$ to $1 \times 10^{16}$ cm$^{-2}$ to be able to expect a gettering effect. And the gettering layer 21 has to be formed relatively deeply so as not to be formed at the surface of the substrate 20. For example, the ion implantation is performed by using relatively higher energy of approximately 100 to 300 keV. By forming the gettering layer 21 deeply, so a crystallinity of the p-type epitaxial layer 10 formed in a subsequence process may be secured satisfactory.

Figure 3B:
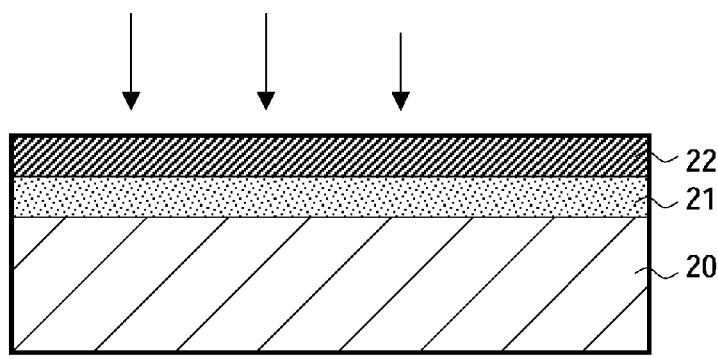

Then, as shown in FIG. 3B, the substrate 20 is performed with the ion implantation of the p-type impurity of boron to form the p$^+$-type impurity layer 22 in the surface thereof which is closer to the surface side than the gettering layer 21.

Figure 3C:
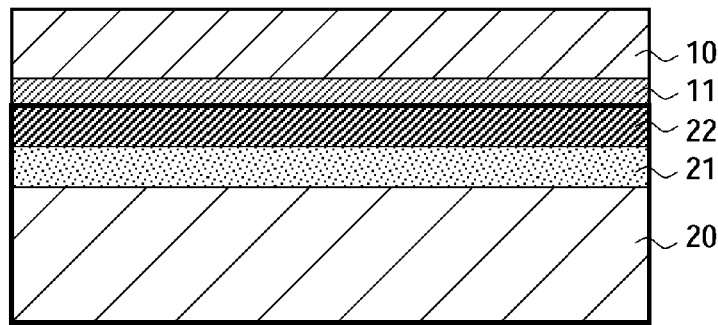

In the case that the contamination prevention film is formed on the surface of the substrate 20, the contamination prevention film may be removed then the p-type epitaxial layer 10 is formed by the epitaxial growth method as shown in FIG. 3C. The thickness and p-type impurity concentration of the p-type epitaxial layer 10 depend on the kind and application of the solid-state imaging device as mentioned above. Note that, a thermal processing (annealing) may be performed before the formation of the p-type epitaxial layer 10 in order to improve the crystallinity of the surface of the substrate 20. The carbon implantation causes a deterioration of the crystallinity of the substrate 20, so that the annealing is performed to improve the crystallinity thereof, consequently a crystallinity of the p-type epitaxial layer 10 formed on the substrate 20 is improved.

The p$^+$-type impurity layer 22 is formed on the surface of the substrate 20, so that the p-type impurity in the p$^+$-type impurity layer 22 is diffused from a boundary between the p-type epitaxial layer 10 and the substrate 20 to the p-type epitaxial layer 10 side. Due to this, the p$^+$-type impurity layer 11 containing the p-type impurity in higher concentration than the p-type epitaxial layer 10 is formed from the boundary to the predetermined depth. The p$^+$-type impurity layer 11 formed in this way has the concentration gradient such that the impurity concentration increases toward the p$^+$-type impurity layer 22 side to be a supply source of the p-type impurity. The p$^+$-type impurity layers 11 and 22 formed in a boundary region are corresponding to first conductive type impurity layers of the present invention. The boundary region includes the boundary of the substrate 20 and the p-type epitaxial layer 10, a part of the substrate 20 facing the boundary and a part of the p-type epitaxial layer 10.

Figure 3D:
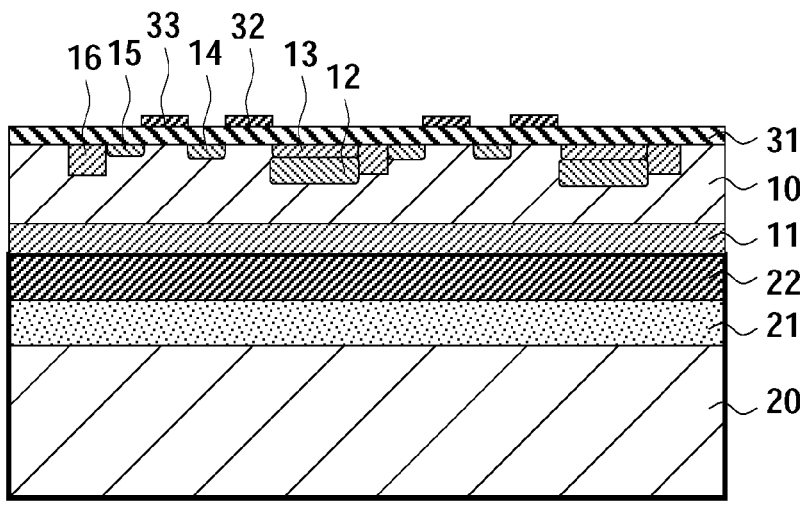

Then, as shown in FIG. 3D, the p-type epitaxial layer 10 is formed with a circuit. For example, the n-type region 12 and the p$^+$-type region 13 to be the photo diode, the n-type region 14 to be the floating diffusion, and the n-type region 15 to be the source or drain of the transistor are formed. And the gate insulation film 31 is formed on the p-type epitaxial layer 10 by a thermal oxidation, and additionally the gate electrodes 32 and 33 of the transistor are formed. Note that, a process of forming them can be changed, and the n-type region 14 and n-type region 15 may be formed after forming the gate electrodes 32 and 33.

Figure 3E:
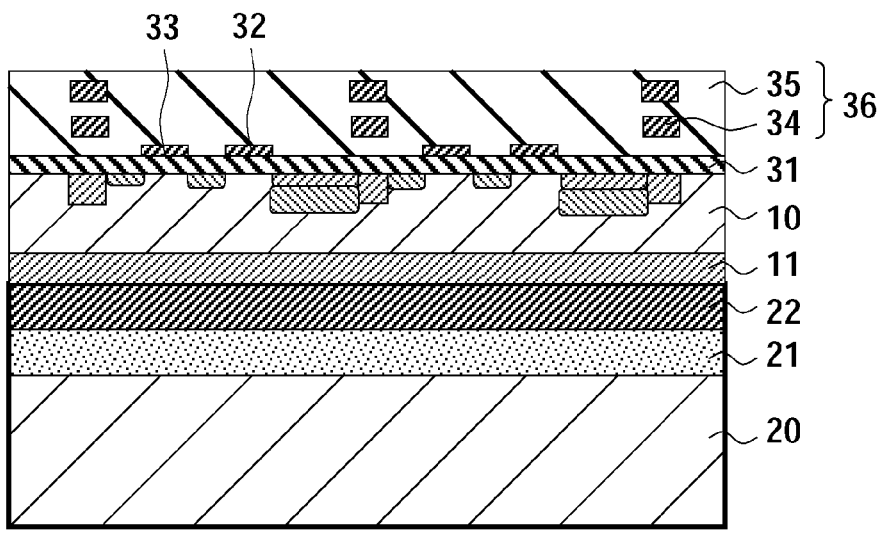

Then, as shown in FIG. 3E, the interconnection layer 36 is formed on the p-type epitaxial layer 10 so as to cover the transistor. In the formation of the interconnection 36, the interconnection 34 and the interlayer insulation film 35 are formed repeatedly to form a multilayered interconnection.

Figure 3F:
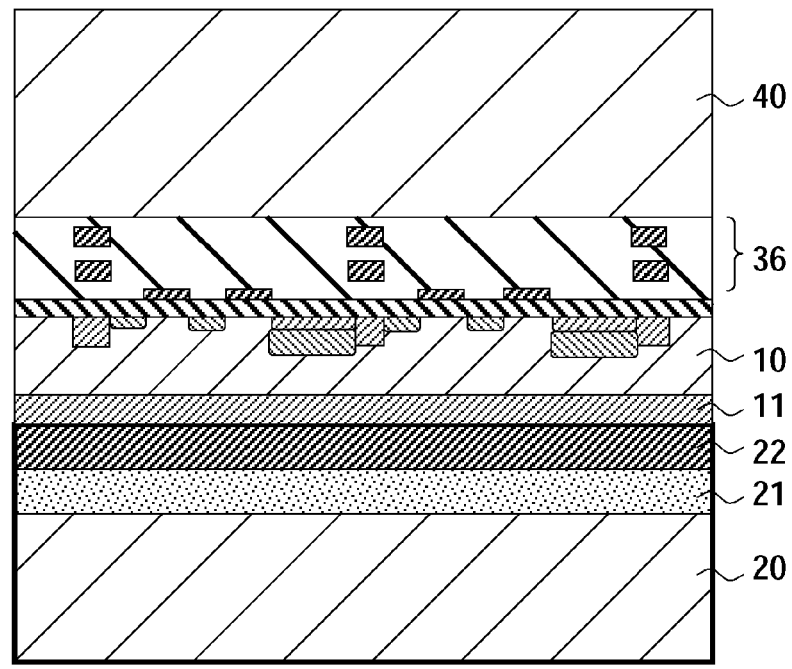

Then, as shown in FIG. 3F, the supporting substrate 40 of silicon is formed on the interconnection layer 36. The supporting substrate 40 may be formed by flowing silicon or bonding a silicon substrate.

Figure 3G:
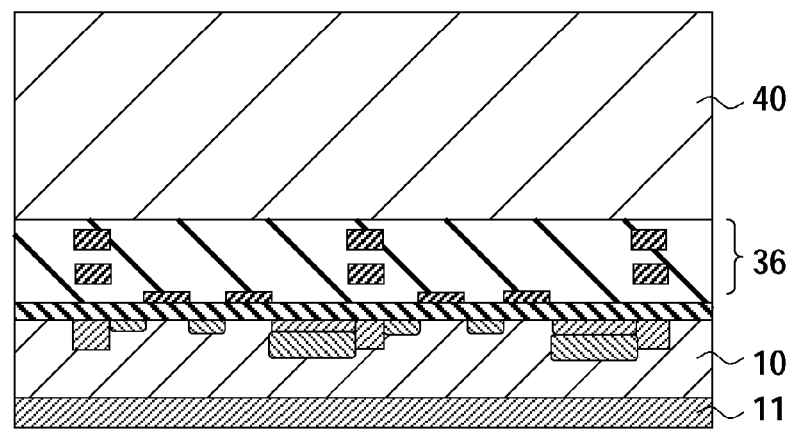

Then, as shown in FIG. 3G, the substrate 20 is removed. The thickness of the substrate 20 is almost 600 to 800 μm. Therefore, the substrate 20 is grinded with several 100 μm by using a grinder, removed with a residual several 10 μm by wet-etching. At that time, the substrate 20 including the gettering layer 21 and the p$^+$-type impurity layer 22 is removed from the back surface side thereof. Further, the surface portion of the p$^+$-type impurity layer 11 is removed so as to expose an inside of the p$^+$-type impurity layer 11 as a removing interface. The wet-etching is performed by using a mixture solution of hydrofluoric acid (HF), nitride acid (HNO$_3$), and acetic acid (CH$_3$COOH) while monitoring the thickness.

Figure 4:
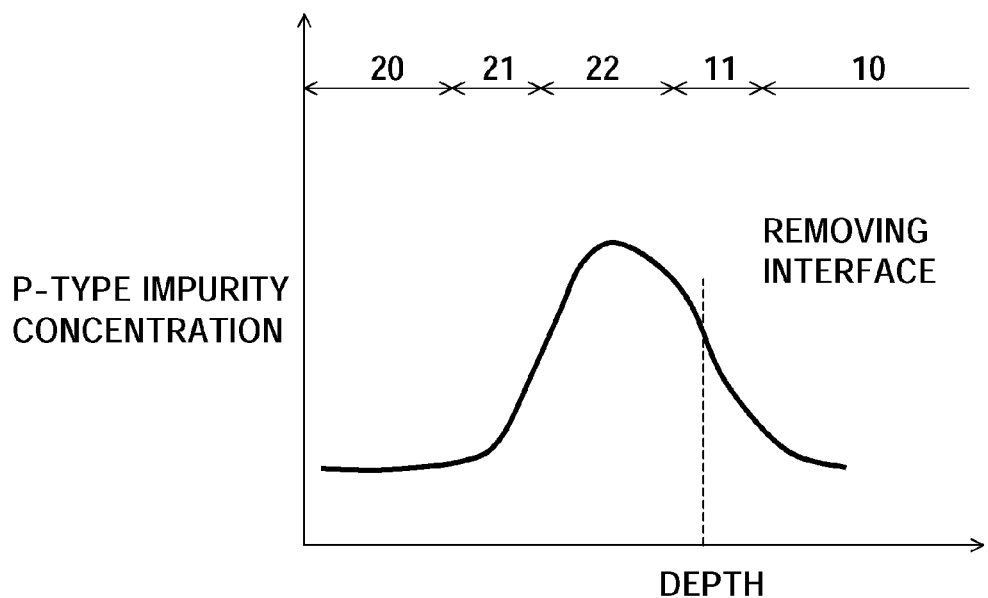
FIG. 4 is a view of a p-type impurity concentration of a depth direction by using an exposed surface of a substrate as a reference position.

FIG. 4 is a view of the p-type impurity concentration of a depth direction by using the exposed surface of the substrate 20 as a reference position (0).

As shown in FIG. 4, the p$^+$-type impurity layer 22 is doped with the p-type impurity in high concentration, so that there is the maximum concentration of the p-type impurity in the p$^+$-type impurity layer 22. As mentioned above, the p$^+$-type impurity layer 11 formed by diffusing the p-type impurity from the p$^+$-type impurity layer 22 has a concentration gradient such that the p-type impurity concentration increases from the p-type epitaxial layer 10 side toward the p$^+$-type impurity layer 22 side. Note that, the p-type impurity in the p$^+$-type impurity layer 22 is diffused in the gettering layer 21 fewer than the p$^+$-type impurity layer 11.

The substrate 20 including the gettering layer 21 and the p$^+$-type impurity layer 22 is removed from the back surface side and the removing interface is formed by exposing an inside of the p$^+$-type impurity layer 11, so that the residual p$^+$-type impurity layer 11 has a concentration gradient such that the p-type impurity concentration is raised close to the removing interface side, and there is the maximum concentration at the removal interface. Crystallinity is low in a boundary of the p$^+$-type impurity layer 22 and the p$^+$-type impurity layer 11, namely a boundary of the substrate 20 and the p-type epitaxial layer 10, so that it is preferably that the p$^+$-type impurity layer 11 is partly removed with its whole surface to expose its inside and to form the removing interface.

In subsequent steps, the p-type epitaxial layer 10 is formed over it with the passivation film 51, the color filter 52, and the on-chip lens 53 successively to form the solid-state imaging device shown in FIG. 1.

As mentioned above, with the method of producing the solid-state imaging device according to the present embodiment, the gettering layer 21 is formed close to the light incidence surface side of the p-type epitaxial layer 10 and remained until the step of removing the substrate 20. Therefore, in the steps of forming the semiconductor regions and the interconnection layers on the p-type epitaxial layer 10 shown in FIGS. 3D and 3E, metal invading the p-type epitaxial layer 10 can be captured by the gettering layer 21 efficiently, and the crystal defects caused by the metal contamination can be suppressed.

As a result, the solid-state imaging device having a small quantity of the dark current and white scratch can be produced. Further, the produced solid-state imaging device does not have the gettering layer 21, so that it is not affected by the dark current from the gettering layer 21 with low crystallinity.

Further, by selecting a temperature, a growth speed, and other conditions in the formation of the p-type epitaxial layer 10, the $p^+$-impurity layer 11 having the desired concentration gradient can be formed. And due to the concentration gradient, the electrons generated by the photoelectric conversion are stored in the n-type region 12 efficiently, so that the solid-state imaging device in high quantum efficiency can be produced.

Furthermore, the p-type impurity has the maximum concentration at the boundary (the second surface) of the p-type epitaxial layer 10, so that the dark current in the vicinity of the boundary can be suppressed.

The above solid-state imaging device can be used to a video camera, a digital steal camera, an electric endoscope camera or other camera.

Figure 5:
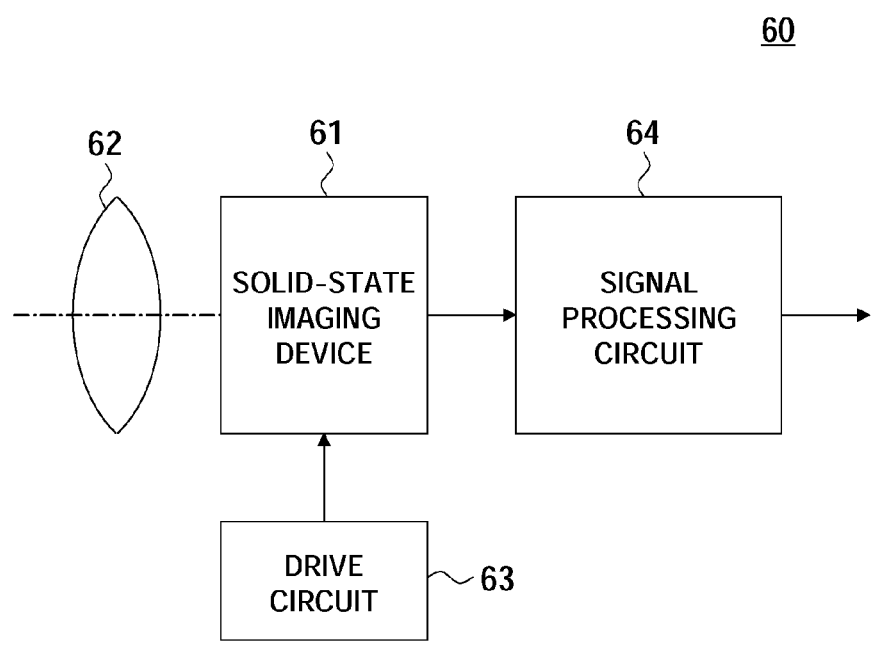
FIG. 5 is a view of a configuration of a camera according to the present embodiment.

FIG. 5 is a view of a configuration of a camera used with the solid-state imaging device.

A camera 60 has the solid-state imaging device 61, a optical system 62, a drive circuit 63, and a signal processing circuit 64. The solid-state imaging device 61 is the back-illuminated solid-state imaging device according to the present embodiment.

The optical system 62 makes imaging light from a subject, namely incidence light, focus on the imaging surface (the second surface) of the solid-state imaging device 61. Consequently, in each of the photodiode of the solid-state imaging device 61, the incidence light is converted to the signal charge in accordance with an amount of the incidence light. And in the n-type region 12, the signal charge is stored for a predetermined period.

The drive circuit 63 supplies the solid-state imaging device 61 with various drive signals. Consequently, the signal charge stored in each of n-type regions 12 of the solid-state imaging device 61 is read out. Further, the solid-state imaging device 1 outputs a signal by the drive.

The signal processing circuit 64 performs various signals processing to an output signal from the solid-state imaging device 61. The output signal is stored in a memory or other storage media after the signal processing by the signal processing circuit 64.

In this way, by applying the solid-state imaging device mentioned above to a camera 60 such as a video camera or a digital steal camera, the dark current can be suppressed and the quantum efficiency can be improved. As a result, the camera improved with an image quality can be realized.

The present invention is not limited to the above embodiment.

The present embodiment is described with the MOS type solid-state imaging device referred to the CMOS image sensor, it can also be applied to a CCD type solid-state imaging device. The formation of the gettering layer 21 may be performed with the ion implantation of other impurities except carbon, for example, phosphorus. The $p^+$-type impurity layer 22 can be formed before forming the gettering layer 21.

Further, if forming the p-type epitaxial layer 10 by multi-steps, the $p^+$-type impurity layer 22 can be formed in the middle of forming the p-type epitaxial layer 10. In this case, the p-type epitaxial layer 10 is formed (at temperature of approximately 1100° C.) again after forming the $p^+$-type impurity layer 22. Therefore, the p-type impurity in the $p^+$-type impurity layer 22 is diffused in the p-type epitaxial layer 10 to form the $p^+$-type impurity layer 11. As a result, the p-type epitaxial layer 10 is formed by at least twice of thermal steps, so that the crystal defects in the gettering layer 21 is grow more, consequently an ability of the gettering can be improved.

Furthermore, the $p^+$-type impurity layer 22 may be formed after forming the p-type epitaxial layer 10. In this case, for example, the $p^+$-type impurity layer 22 is formed and then annealed in order to improve the crystallinity of the p-type epitaxial layer 10, as a result, the p-type impurity in the $p^+$-type impurity layer 22 is diffused to the p-type epitaxial layer 10 to form the $p^+$-type impurity layer 11.

In the present embodiment, the p-type epitaxial layer 10 is used. If using a hole as a signal charge, for example, an n-type epitaxial layer can be used. In this case, polarities of the respective impurity regions may be reversed. For example, an $n^+$-type impunity layer may be used instead of the $p^+$-type impurity layer 11.

It should be understood by those skilled in the art that various modifications, combinations, sub-combinations and alterations may occur depending on design requirements and other factors in so far as they are within scope of the appeared claims or the equivalents thereof.

What is claimed is:

1. A method of producing a solid-state imaging device comprising:
    forming a structure including (a) a substrate, (b) a first conductive type Si layer and (c) a first conductive type impurity layer, said first conductive type Si layer being formed on the substrate, and said first conductive type impurity layer being formed in a boundary region, the boundary region including (i) a boundary of said substrate and said first conductive Si layer, (ii) a part of said substrate facing the boundary, and (iii) a part of said first conductive type Si layer facing the boundary;
    forming in said first conductive type Si layer a second conductive type region capable of storing in said Si layer a charge generated by a photoelectric conversion; and
    forming an interconnection layer on said first conductive type Si layer,
    wherein,
        said first conductive type impurity layer is formed to have a concentration gradient such that an impurity concentration increases from the first conductive type Si layer side toward the substrate side.

2. A method of producing a solid-state imaging device as set forth in claim 1, further comprising:
    removing said substrate.

3. A method of producing a solid-state imaging device as set forth in claim 1, wherein said first conductive type impurity layer has a first conductive type impurity concentration that is higher than that of said first conductive type Si layer.

4. A method of producing a solid-state imaging device as set forth in claim 2, further comprising:
   partially removing said first conductive type impurity layer.

5. A method of producing a solid-state imaging device as set forth in claim 1, wherein forming said structure includes:
   doping a first conductive type impurity in said substrate, and
   forming said first conductive type Si layer on said substrate after doping said first conductive type impurity in said substrate,
   wherein,
      said first conductive type impurity doped in said substrate is diffused into said first conductive type Si layer to form said first conductive type impurity layer in the boundary region.

6. A method of producing a solid-state imaging device as set forth in claim 1, wherein forming said structure includes:
   forming said first conductive type Si layer on said substrate, and
   doping a first conductive type impurity in said substrate in the middle of or after forming said first conductive type Si layer,
   wherein,
      said first conductive type impurity doped in said substrate is diffused into said first conductive type Si layer to form said first conductive type impurity layer in the boundary region.

7. A method of producing a solid-state imaging device as set forth in claim 2, further comprising:
   forming a supporting substrate on said interconnection layer after forming said interconnection layer and before removing said substrate.

8. A method of producing a solid-state imaging device as set forth in claim 1, wherein said first conductive type Si layer is an epitaxial layer.

9. A method of producing a solid-state imaging device comprising:
   forming a structure including (a) a substrate, (b) a first conductive type Si layer and (c) a first conductive type impurity layer, said first conductive type Si layer being formed on the substrate, and said first conductive type impurity layer being formed in a boundary region, the boundary region including (i) a boundary of said substrate and said first conductive Si layer, (ii) a part of said substrate facing the boundary, and (iii) a part of said first conductive type Si layer facing the boundary;
   forming in said first conductive type Si layer a second conductive type region capable of storing in said first conductive type Si layer a charge generated by a photoelectric conversion;
   forming an interconnection layer on said Si layer; and
   forming a gettering layer by doping a group IV element in said substrate.

10. A method of producing a solid-state imaging device as set forth in claim 9, wherein said gettering layer is formed by doping carbon into said substrate.

* * * * *

UNITED STATES PATENT AND TRADEMARK OFFICE
CERTIFICATE OF CORRECTION

| | | |
|---|---|---|
| PATENT NO. | : 8,084,286 B2 | |
| APPLICATION NO. | : 12/943440 | |
| DATED | : December 27, 2011 | |
| INVENTOR(S) | : Hideo Kanbe | |

It is certified that error appears in the above-identified patent and that said Letters Patent is hereby corrected as shown below:

On the Title Page:

Item (60) "division of application No. 11/169,592 filed on Jun. 26, 2005"

should be

Item (60) --division of application No. 11/169,592 filed on Jun. 29, 2005--

Signed and Sealed this
Seventeenth Day of April, 2012

David J. Kappos
*Director of the United States Patent and Trademark Office*